United States Patent
Modak

(10) Patent No.: US 6,537,913 B2
(45) Date of Patent: Mar. 25, 2003

(54) METHOD OF MAKING A SEMICONDUCTOR DEVICE WITH ALUMINUM CAPPED COPPER INTERCONNECT PADS

(75) Inventor: Anjaneya Modak, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/895,522

(22) Filed: Jun. 29, 2001

(65) Prior Publication Data

US 2003/0003711 A1 Jan. 2, 2003

(51) Int. Cl.⁷ .............................................. H01L 21/44
(52) U.S. Cl. ..................... 438/687; 438/627; 438/629; 438/633; 438/672; 438/688
(58) Field of Search ................... 438/672, 687, 438/688, 629, 633, 627

(56) References Cited

U.S. PATENT DOCUMENTS 6,090,696 A    7/2000   Jang et al.
6,114,243 A *  9/2000   Gupta et al. ................. 438/687
6,191,029 B1   2/2001   Hsiao et al.
6,323,558 B1 * 11/2001  Jeong ......................... 257/774

OTHER PUBLICATIONS

R. Contolini et al., "Electrochemical Planarization for Multilevel Metallization", The Electrochemical Society, Inc., vol. 141, No. 9, Sep. 1994, ppg 2503–2510.
R. Contolini et al., "A Copper Via Plug Process by Electrochemical Planarization", 1993 VSLI Multilevel Interconnection Conference, Jun. 8–9, 1993, Santa Clara, California.

* cited by examiner

Primary Examiner—John F. Niebling
Assistant Examiner—Lynne A. Gurley
(74) Attorney, Agent, or Firm—Blakely, Sokoloff, Taylor & Zafman LLP

(57) ABSTRACT

A method for making a semiconductor device is described. That method includes forming a dielectric layer on a substrate, then etching a trench into the dielectric layer. After filling the trench with copper, a portion of the copper is removed to form a recessed copper plug within the dielectric layer. A capping layer that comprises aluminum is then formed on the recessed copper plug.

13 Claims, 3 Drawing Sheets

METHOD OF MAKING A SEMICONDUCTOR DEVICE WITH ALUMINUM CAPPED COPPER INTERCONNECT PADS

FIELD OF THE INVENTION

The present invention relates to a method for making semiconductor devices, particularly those that include copper interconnect pads that have aluminum caps.

BACKGROUND OF THE INVENTION

One way to connect a semiconductor die to the device's package is to wirebond an interconnect pad, which is located on the die, to the package. When copper is used to make such an interconnect pad, the copper may oxidize if exposed. Consequently, to make a copper containing interconnect pad, an aluminum cap may be formed on the copper to protect it from oxidation. The wirebond is then made to the aluminum cap.

The conventional process for forming an aluminum cap on a copper containing interconnect pad includes the following steps. Copper is deposited onto a dielectric layer to fill a trench that has been formed in that layer. The copper is then polished to remove it from the surface of the dielectric layer to generate a structure in which the surface of the remaining copper is substantially flush with the surface of the dielectric layer. Aluminum is deposited onto the surface of the copper and the adjoining dielectric layer. Next, a lithography and etch process is used to remove the aluminum from the dielectric layer—retaining it on top of the copper only. After conventional post etch photoresist ash and clean steps, a passivation layer is formed on top of the resulting structure.

The conventional process for forming aluminum caps on copper containing interconnect pads is relatively expensive and complex. In addition, because the structure, which this process creates, includes aluminum caps that rise above the surface of the dielectric layer, relatively narrow gaps may separate adjacent caps. It may be difficult to fill those gaps with the passivation layer that is deposited over the aluminum caps and the dielectric layer. To fill them, the passivation layer may have to be deposited using a high density plasma process. That layer may then have to be planarized. This adds still more complexity to the process.

Accordingly, there is a need for a relatively inexpensive and less complex process for making a semiconductor device that includes aluminum capped copper interconnect pads. There is also a need for such a process that generates an aluminum capped structure in which the surface of the cap is substantially flush with the surface of the adjacent dielectric layer. The present invention provides such a process.

DETAILED DESCRIPTION OF THE PRESENT INVENTION

Figure 1A:
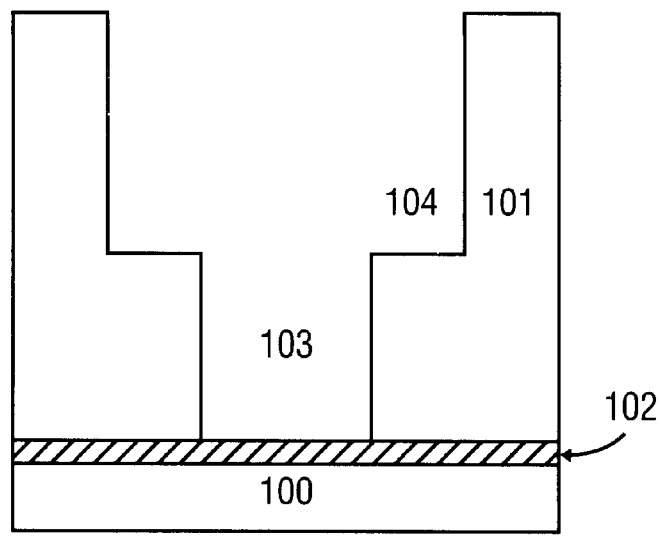
FIGS. 1a–1f represent cross-sections of structures that may result when certain steps are used to carry out an embodiment of the method of the present invention.

A method for making a semiconductor device is described. In that method, dielectric layer 101 is formed on barrier layer 102, which has been formed on substrate 100. Via 103 and trench 104 are then formed in dielectric layer 101 using conventional lithography and etch techniques. The resulting structure is illustrated in FIG. 1a. Substrate 100 may be any surface, generated when making a semiconductor device, upon which a dielectric layer may be formed. Substrate 100 thus may include, for example, active and passive devices that are formed on a silicon wafer such as transistors, capacitors, resistors, diffused junctions, gate electrodes, local interconnects, etc. . . . Substrate 100 also may include one or more conductive layers that are separated from each other, or from such active and passive devices, by one or more dielectric layers. In a preferred embodiment of the present invention, substrate 100 comprises a structure upon which may be formed a dual damascene interconnect that provides an interconnect pad for the device.

Barrier layer 102 will serve to prevent an unacceptable amount of copper from diffusing into dielectric layer 101, and may also serve as an etch stop. Barrier layer 102 preferably comprises a refractory material, such as tantalum, tantalum nitride or titanium nitride. Particularly preferred is a two layer stack that includes an underlying tantalum nitride layer upon which is formed a tantalum layer. When comprising such a two layer stack, a conventional physical vapor deposition ("PVD") process may be used to form barrier layer 102. Barrier layer 102 should be thick enough to perform its diffusion inhibition and etch stop functions, e.g., being between about 10 and about 50 nanometers thick.

Dielectric layer 101 may comprise any material that may insulate one conductive layer from another. Preferred are insulating materials with a dielectric constant that is lower than the dielectric constant of silicon dioxide, e.g., porous oxide; carbon or fluorine doped oxide; organic containing silicon oxides; or various polymers. A particularly preferred material for making dielectric layer 101 is a fluorosilicate glass ("FSG"), which may be deposited onto substrate 100 using a conventional high density plasma ("HDP") process.

Dielectric layer 101 may alternatively comprise an organic polymer. Such organic polymers include, for example, polyimides, parylenes, polyarylethers, organosilicones, polynaphthalenes, and polyquinolines, or copolymers thereof. Commercially available polymers sold by Honeywell, Inc., under the trade name FLARE™, and by the Dow Chemical Company, under the trade name SiLK™, may be used to form dielectric layer 101. When dielectric layer 101 comprises a polymer, it is preferably formed by spin coating the polymer onto the surface of substrate 100 using conventional equipment and process steps.

Dielectric layer 101 may also be made from a compound having the molecular structure $Si_xO_yR_z$, in which R may be hydrogen, carbon, an aliphatic hydrocarbon or an aromatic hydrocarbon. When "R" is an alkyl or aryl group, the resulting composition is often referred to as carbon-doped oxide. When dielectric layer 101 comprises a carbon-doped oxide, dielectric layer 101 preferably includes between about 5 and about 50 atom % carbon. More preferably, such a compound includes about 15 atom % carbon.

Examples of other types of materials that may be used to form dielectric layer 101 include aerogel, xerogel, and spin-on-glass ("SOG"). In addition, dielectric layer 101 may comprise either hydrogen silsesquioxane ("HSQ"), methyl silsesquioxane ("MSQ"), or other materials having the molecular structure specified above, which may be coated onto the surface of a semiconductor wafer using a conventional spin coating process. Although spin coating may be a preferred way to form layer 101 for some materials, for others a plasma enhanced chemical vapor deposition ("PECVD") process may be preferred.

After via 103 and trench 104 are formed, they are lined with barrier layer 106. Barrier layer 106 will serve to prevent an unacceptable amount of copper from diffusing into dielectric layer 101. Barrier layer 106, like barrier layer 102, preferably comprises a refractory material, such as tantalum, tantalum nitride or titanium nitride. Also like barrier layer 102, particularly preferred is a two layer tantalum nitride, tantalum stack, formed using a conventional PVD process. Barrier layer 106 should be thick enough to perform its diffusion inhibition function, e.g., being between about 10 and about 50 nanometers thick.

Figure 1B:
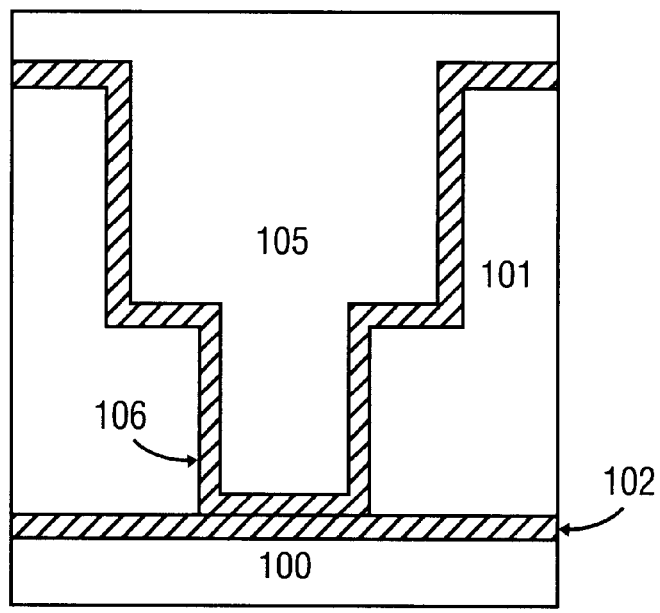

After lining via 103 and trench 104 with barrier layer 106, via 103 and trench 104 are filled with copper, when forming copper layer 105. This generates the structure shown in FIG. 1b. Copper layer 105 may be formed using a conventional copper electroplating process. Such a process typically comprises depositing a barrier layer (e.g., barrier layer 106 shown in FIG. 1b) followed by depositing a seed material (e.g., one made of copper), then performing a copper electroplating process to produce the copper layer, as is well known to those skilled in the art.

In a typical process, after copper layer 105 is deposited, it is polished, e.g, by applying a chemical mechanical polishing ("CMP") step, until its surface is substantially flush with (or recessed slightly below) the surface of dielectric layer 101. (That polishing step may be followed by a standard cleaning step.) In, however, the process of the present invention, a significantly greater amount of copper layer 105 is removed, without simultaneously removing significant amounts of dielectric layer 101, to form a relatively highly recessed copper plug within layer 101.

There are many ways to remove additional amounts of copper layer 105 without removing a substantial portion of dielectric layer 101. For example, an electropolish process may be applied to generate a recessed copper plug. Such a process will generally require that electrical contact be maintained to copper layer 105. In the embodiment described here, electrical contact may be maintained with copper layer 105 because layer 105 is formed on a dissimilar, relatively thin, conductive layer that lines the trench—i.e., barrier layer 106.

The electropolish process itself is well known to those skilled in the art, consisting essentially of contacting the surface to be polished with an appropriate solution chemistry, then applying an electrical potential to that surface. See, e.g., R. Contolini, A. Bernhardt, and S. Mayer, *Electrochemical Planarization for Multilevel Metallization*, J. Electrochem. Soc., Vol. 141, No. 9, pp. 2503–2510 (September 1994). Such a process may enable the controlled, selective removal of copper from the surface of a copper layer. In one example, portions of a copper layer may be removed by exposing that layer's surface to a phosphoric acid containing solution, then applying an electrical potential of between about 1 and about 1.5V (with respect to a copper reference electrode) for a period of time sufficient to remove the desired amount of copper from the copper layer. The electrical potential may be applied in a steady state fashion, or alternatively, in a dynamic fashion—e.g., by using pulsed plating. Preferably, current density is maintained between about 15 and about 20 mA/cm$^2$.

In this embodiment of the present invention, copper layer 105 must be recessed sufficiently deep into dielectric layer 101 to ensure that a subsequently deposited aluminum layer will maintain a sufficient thickness to serve as an aluminum capping layer that protects the underlying copper from oxidation, even after the aluminum layer has been polished and cleaned. In a preferred embodiment, copper layer 105 is polished until its upper surface is separated from the surface of dielectric layer 101 by at least about 50 nanometers, and more preferably by at least about 200 nanometers.

Figure 1C:
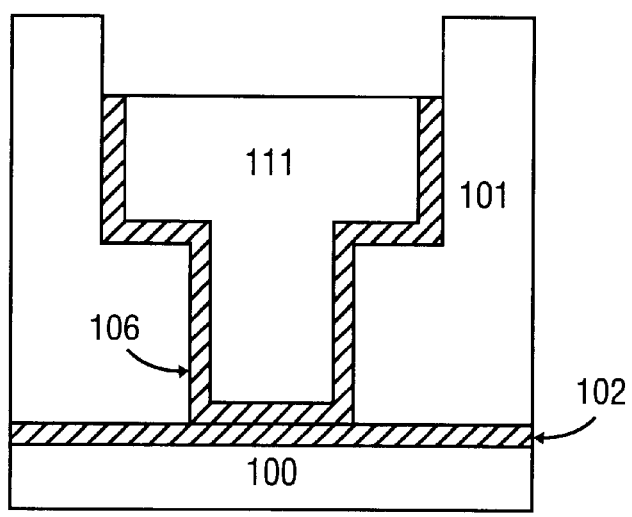

A relatively highly recessed copper plug may instead be formed by adjusting the parameters applied during the CMP process, such as by enhancing the chemical etch contribution to the polishing process near the end of that treatment. A standard cleaning step may follow such a modified polishing step. Such a recessed copper plug may also be formed by applying a selective wet etch process (which follows a conventional CMP polish and clean sequence) to etch the copper at a significantly faster rate than it etches dielectric layer 101. Removing a portion of copper layer 105 (along with the adjacent part of barrier layer 106), without simultaneously removing a significant portion of dielectric layer 101, produces the structure shown in FIG. 1c, which includes recessed copper plug 111.

After forming recessed copper plug 111, barrier layer 107 is formed on its surface. Barrier layer 107 preferably comprises a titanium nitride layer. Barrier layer 107 may be deposited over dielectric layer 101 and copper plug 111 using a conventional PVD process. Layer 107 preferably should be deposited at a thickness of between about 10 and about 50 nanometers. Although in this embodiment, layer 107 comprises a titanium nitride layer, additional layers (or layers made from other materials, e.g., tantalum nitride, tantalum, or titanium) may be used instead without departing from the spirit and scope of the present invention.

Figure 1D:
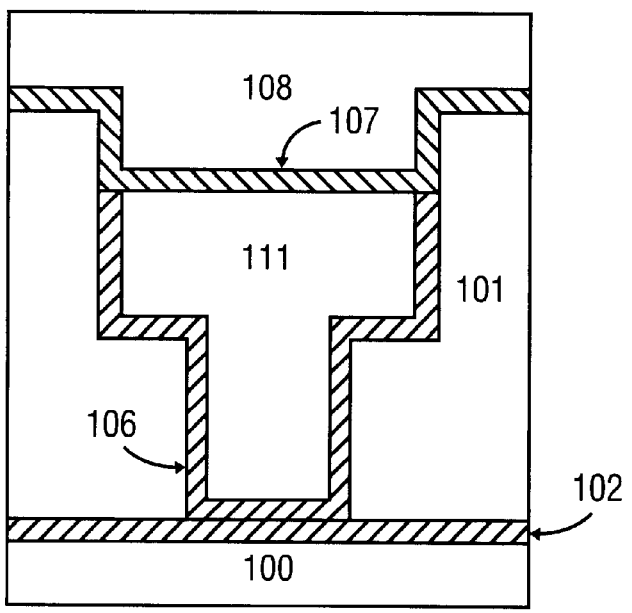

Next, aluminum layer 108 is deposited onto barrier layer 107, filling the recess located above copper plug 111 and covering dielectric layer 101. Aluminum layer 108 may be deposited using a conventional PVD process, or alternatively using a process that is performed at an increased temperature to facilitate the filling of the recess. The resulting structure is shown in FIG. 1d. Although not done in this embodiment of the present invention, layers of titanium nitride, titanium, tantalum nitride, tantalum, or other materials may be formed on top of aluminum layer 108.

Next, the portions of aluminum layer 108 and barrier layer 107 that cover dielectric layer 101 are removed. In a preferred embodiment, those portions are removed using a conventional CMP step. Optimally, at the end of that CMP step, the surface of the remaining portions of aluminum layer 108 is substantially flush with the surface of dielectric layer 101. A cleaning step may follow that CMP step.

Figure 1E:
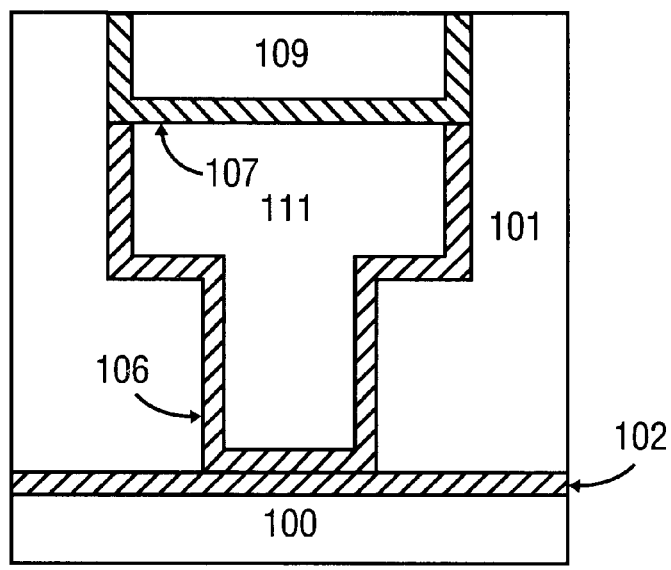

After removing layers 108 and 107 from dielectric layer 101, the resulting structure includes an aluminum capping layer 109, which is formed on copper plug 111, as shown in FIG. 1e. Aluminum capping layer 109 will serve to inhibit oxidation of the underlying copper plug 111. To perform that function, aluminum capping layer 109 preferably is between about 50 and about 200 nanometers thick. The optimal thickness will, of course, depend upon the thickness required to provide this protective function for a particular application.

Figure 1F:
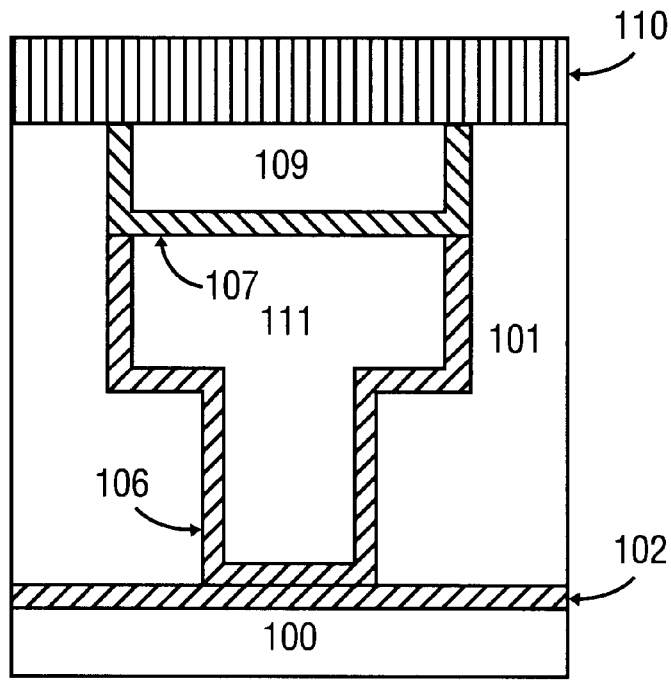

After forming aluminum capping layer 109, passivation layer 110 is formed on its surface, and the surface of dielectric layer 101, as shown in FIG. 1f. Passivation layer 110 may be made in the conventional manner using conventional materials, e.g., silicon nitride, silicon dioxide, polyimide or another type of polymer. Conventional processing may follow to provide a wirebond contact to aluminum capping layer 109.

The method of the present invention enables an aluminum capping layer to be formed on top of a copper interconnect pad in a self-aligned manner, and without having to apply a lithography, etch, photoresist ash, and post etch clean sequence, which adds complexity and expense. In addition, the method of the present invention generates a structure in which the surface of aluminum capping layer 109 is substantially flush with the surface of dielectric layer 101. Because the resulting topology does not have narrow gaps between aluminum caps, relatively complex process steps, which may be required to fill those gaps, are unnecessary. Moreover, that flat surface means the passivation layer will not require planarization and may enable that layer's thickness to be reduced. The process of the present invention thus enables aluminum caps to be formed on copper containing interconnect pads in a relatively simple and inexpensive manner.

Features shown in the above referenced drawings are not intended to be drawn to scale, nor are they intended to be shown in precise positional relationship. Additional steps that may be included in the above described method have been omitted as they are not useful to describe aspects of the present invention.

Although the foregoing description has specified certain steps, materials, and equipment that may be used in such a method to make a semiconductor device, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method of making a copper containing interconnect pad for a semiconductor device comprising:
    forming a dielectric layer on a substrate;
    etching a trench into the dielectic layer;
    lining the trench with a first barrier layer;
    filling the trench with copper;
    removing a portion of the copper to form a recessed copper plug within the dielectric layer;
    forming a second barrier layer on the recessed copper plug;
    forming on the second barrier layer a layer that comprises aluminum;
    removing substantially all of the aluminum and substantially all of the second barrier layer from the surface of the dielectric layer; and
    forming a passivation layer on the surface of the aluminum layer and on the surface of the dielectric layer.

2. The method of claim 1 wherein the recessed copper plug is formed by applying a chemical mechanical polishing step to remove a portion of the copper followed by applying a cleaning step to remove residues that the chemical mechanical polishing step generated.

3. The method of claim 1 wherein the recessed copper plug is formed by applying a selective wet etch process that removes copper significantly faster than it removes the dielectric layer.

4. The method of claim 1 wherein the second barrier layer comprises a layer of titanium nitride that is formed on the recessed copper plug.

5. The method of claim 1 wherein the second barrier layer is between about 10 and about 50 nanometers thick.

6. The method of claim 5 wherein the surface of the recessed copper plug lies between about 50 and about 100 nanometers below the surface of the dielectric layers.

7. The method of claim 6 wherein the dielectric layer comprises a fluorosilicate glass.

8. A method of making a copper containing interconnect pad for a semiconductor device comprising:
    forming a dielectric layer on a substrate;
    etching a trench into the dielectric layer;
    lining the trench with a barrier layer;
    depositing a layer of copper onto the dielectric layer to fill the trench;
    applying a chemical mechanical polishing step to remove the copper from the surface of the dielectric layer;
    removing a portion of the remaining copper to form a recessed copper plug within the dielectric layer;
    forming a titanium nitride layer on the processed copper plug;
    forming on the titanium nitride layer a layer that comprises aluminum;
    applying a chemical mechanical polishing step to remove substantially all of the aluminum and substantially all of the titanium nitride from the surface of the dielectric layer;
    applying a cleaning process to remove residues that the chemical mechanical polishing stop generated; and
    forming a passivation layer on the surface of the aluminum layer and on the surface of the dielectric layer.

9. The method of claim 8 wherein the recessed copper plug is formed by the chemical mechanical polishing step that removed the copper from the surface of the dielectric layer, and wherein a cleaning step is subsequently applied to remove residues that the chemical mechanical polishing step generated.

10. The method of claim 8 wherein the recessed copper plug is formed by applying a selective wet etch process that removes copper significantly faster than it removes the dielectric layer.

11. The method of claim 8 wherein the titanium nitride layer is between about 10 and about 50 nanometers thick.

12. The method of claim 8 wherein the surface of the recessed copper plug lies between about 50 and about 200 nanometers below the surface of the dielectric layer.

13. The method of claim 8 wherein the dielectric layer comprises a fluorosilicate glass.

* * * * *